United States Patent [19]

Schweitzer, III et al.

[11] Patent Number: 4,766,549

[45] Date of Patent: Aug. 23, 1988

[54] SINGLE-ENDED TRANSMISSION LINE FAULT LOCATOR

[75] Inventors: Edmund O. Schweitzer, III; Masaoki Ando, both of Pullman, Wash.

[73] Assignee: Electric Power Research Institute, Inc., Palo Alto, Calif.

[21] Appl. No.: 676,747

[22] Filed: Nov. 30, 1984

[51] Int. Cl.[4] .................... G06F 15/56; G01R 31/08
[52] U.S. Cl. ................................. 364/481; 324/522; 324/533; 324/555; 361/81; 364/483; 364/492
[58] Field of Search .............. 364/482, 483, 487, 492, 364/481; 324/51, 52; 361/79, 80, 81

[56] References Cited

U.S. PATENT DOCUMENTS

| | | | |
|---|---|---|---|
| 4,107,778 | 8/1978 | Nii et al. | 364/492 |
| 4,342,064 | 7/1982 | Wilkinson | 361/80 |
| 4,390,835 | 6/1983 | Elkateb et al. | 361/79 |
| 4,466,071 | 8/1984 | Russell, Jr. | 364/482 |
| 4,499,417 | 2/1985 | Wright et al. | 324/52 |
| 4,559,491 | 12/1985 | Saha | 364/492 |
| 4,560,922 | 12/1985 | Heller et al. | 324/52 |
| 4,591,992 | 5/1986 | Yamaura | 361/79 |

OTHER PUBLICATIONS

T. W. Stringfield, et al., "Fault Location Methods for Overhead Lines," AIEE (Power Apparatus and Systems), vol. 76, pp. 518–530, Aug. 1957.

E. W. Kimbark, "Transient Overvoltages Caused by Monopolar Ground Fault on Bipolar DC Line: Theory and Simulation," *IEEE Trans. on Power and Apparatus and Systems*, vol. PAS-89, No. 4, pp. 584–592, Apr. 1970.

Marihart, D. J. and Haagenson, N. W., "Automatic Fault Locator for Bonneville Power Administration", IEEE 1972 Summer Power Meeting, Paper No. C72 513-0.

*Primary Examiner*—Parshotam S. Lall
*Assistant Examiner*—Kevin J. Teska
*Attorney, Agent, or Firm*—Flehr, Hohbach, Test, Albritton & Herbert

[57] ABSTRACT

A system for locating faults on a transmission line by taking measurements at only one end of the line.

19 Claims, 4 Drawing Sheets

SINGLE-ENDED TRANSMISSION LINE FAULT LOCATOR

The present invention is related to systems for location transmission line faults, and more particularly to a system for locating faults on two-terminal high voltage direct current ("HVDC") transmission lines which uses measurements taken from only one end of the transmission line.

The most widely used fault locator for two-terminal HVDC transmission lines is the Bonneville Power Administration ("BPA") "Type B" fault locator whose operating principle is described as follows. When line faults occur, surges are created, and they propagate towards the opposite ends of the line. The arrival of the surge wave-front at one terminal starts an electronic counter. The surgers are detected by capacitor coupling units and threshold detectors. As soon as the other end catches the surge wave-front created by the same line fault, a transmitter at this end sends a signal to the first terminal over a microwave channel. The signal stops the counter. The fault locating equipment is calibrated to translate the time lapse between the arrival of the two pulses into the fault location in miles. The claimed accuracy is 0.1 mile. Advantages of the "Type B" fault locator are its simple principle and accuracy. Disadvantages are its high cost and the requirement of a wideband microwave channel.

These disadvantages demand a single-end fault location technique. One technique developed heretofore utilizes a passive reflectometer for locating line faults by using line voltages and currents at one terminal along with knowledge of the physical characteristic of the line. The voltage at the fault must be close to zero. Therefore, one way of locating faults is to find the location of a stationary voltage zero on the line. Disadvantages of the passive reflectometer are high computational burden (requires complicated digital filtering for lossy lines), difficulty in locating high impedance faults, and the requirement for precise knowledge of the modal parameters of the transmission line.

Another technique used heretofore was the BPA "Type A" fault locator. This technique is described in the paper by T. W. Stringfield, D. J. Marihart, and R. F. Stevens, "Fault Location Methods for Overhead Lines." *AIEE* (Power Apparatus and Systems), Vol. 76, pp. 518-530, August, 1957. The "Type A" fault locator uses successive reflections of the fault-generated wave from the fault. The reflections were originally automatically recorded by photographs taken at a cathode-ray oscillographic trace. By measuring the interval between the disturbances, the location of the fault could be obtained. The accuracy of this technique was limited by the size and calibration of the oscillograph display. It was suggested, however, that by discriminating in favor of the reflection from the far end terminal (using a very short time constant in the coupling) it may be possible to obtain reliable operation of an electronic time interval counter.

The present invention offers an improvement over the above-discussed techniques. The present invention utilizes reflections from the fault as well as reflections from the far-end terminal, as observed from one end. An algorithm is utilized to estimate transient arrival times. The new single-end fault location technique of the present invention is referred to as simple passive reflectometer ("SPR").

The SPR uses successive reflections generated by a transmission line fault. In general there are large impedance mismatches at faults and at the line terminals, so that the reflections cause steep transients. From measurements of the first two consecutive transient arrival times, the fault location can be calculated.

Upon the occurrence of a fault, equal-magnitude voltage traveling waves are launched with equal signs, towards both ends of the line. On the other hand, equal-magnitude current traveling waves propagate away from the fault with opposite signs. When both voltage and current traveling waves arrive at a termination station, some energy of the traveling waves is transmitted through the station termination circuit and the rest is reflected back towards the fault. The reflection coefficient at the station depends on the termination circuit but the voltage and current reflection coefficients are always of opposite sign. If, for instance, the station termination is capacitive then it initially looks like a short circuit. Therefore, the current (voltage) reflection coefficient is of positive (negative) sign.

The capacitive termination causes very steep changes in the observed current when the traveling wave reaches the station. The reflected traveling waves move toward the fault, and substantial traveling-wave energy is reflected back toward the station, since the fault is approximately a short circuit. The voltage reflection coefficient is positive. At the same time, a part of the traveling-wave energy is transmitted through the fault due to non-zero fault impedance and mutual coupling of the lines. The voltage and current transmission coefficients are always positive.

The traveling waves are easily detected at the stations employing a differentiator-smoother as described hereinafter. The time between the arrival of the transients contains the fault-location information.

An object of the present invention is thus to provide a system for locating faults on transmission lines wherein measurements are made at only one end of the line.

Another object of the present invention is to provide a system for locating electrical faults on HVDC lines from one end thereof utilizing reflections from the fault as well as reflections from the far-end terminal, as observed from one end.

Yet another object of the present invention is to provide a system for locating electrical faults on two-terminal HVDC lines which uses information from only one end of the line wherein the slopes of transient wave forms are computed, the best estimated peaks of the slopes for the first two consecutive transients obtained, and the time interval between these peaks measured to provide the fault location.

The system of the present invention includes an event-detection scheme for detecting transients at a measuring point at one end of a transmission line generated by a fault on the line. The event-detection scheme may comprise a digital filter and a threshold detector. Voltage and/or current transients may be detected. The transients at one end of the line are sorted by polarity. The arrival times of the transients at one end of the line are determined, and the difference between the arrival lines calculated to determine fault location.

The system considers the wave (voltage and/or current) reaching the measuring point directly; the wave reflected from the measuring point, travelling to the fault, reflected by the fault, and travelling back to the measuring point; and the wave launched by the fault, reflected at the far end of the line, travelling back to the fault, transmitted through the fault, and then reaching the measuring point.

The system of the present invention accommodates mutual coupling between transmission line conductors so that fault location is not entirely dependent upon the measurements from the faulted conductor. Particularly, the system is capable of locating faults even if no data are available from the faulted conductor, but are available from the unfaulted conductor.

The system relies on impedance discontinuities at at least one end of the line. The system, however, does not require detailed knowledge or measurement of the impedance discontinuity.

The system may be implementated in a computer-based system wherein the fault location means is implemented in a computer program. The system is functional with any or all of the following: voltage measurements taken from either or both conductors, current measurements taken from either or both conductors, or backward-travelling wave determined from the voltage data, current data and surge impedance of the line.

The system of the present invention may be utilized to measure the line length and distance from the fault to the far end of the line as well as the distance from the fault to the near end of the line or the measuring point. The system may locate all of the following fault types: ground faults, line-line faults, line-line-ground faults, and one open conductor. The system is only mildly affected by arc or fault resistance.

The present invention will be described hereinafter in conjunction with the following drawings.

Figure 1:
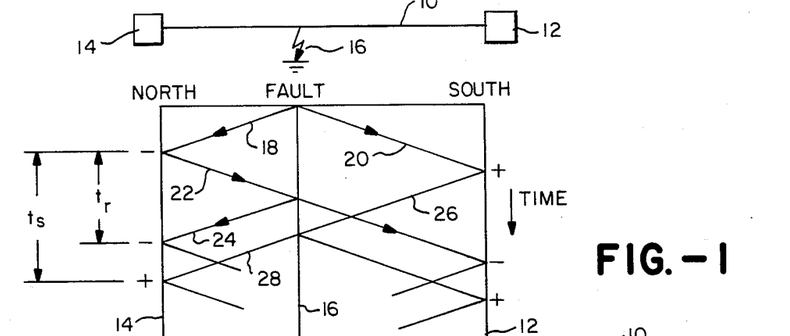
FIG. 1 is a lattice diagram illustrating relative times of arrival for fault-generated transients at opposite ends of a transmission line.

Referring now the drawings, FIG. 1 shows, by way of example, a two-terminal transmission line 10 having a south terminal 12 and a north terminal 14. The transmission line is terminated capacitively. However, it may be terminated other than in a capacitive manner. A fault 16 is depicted as occurring at a point less than halfway down the transmission line as measured from the north end 14.

To explain the operating principle of the present invention, it is assumed that the fault launches a negative current wave 18 in the north direction. Then a positive current wave 20 is launched to the south. The disturbance produced by the fault reaches the north end, and is reflected as current wave 22. The reflected current wave 22 has the same polarity as the incoming current wave 18, since in the time period of concern, the capacitive termination appears as a short circuit. Thus, the first transient seen is a negative one. Since the fault is less than halfway down the line, the wave just reflected at the north end (wave 22) has time to travel back to the fault, reflect as wave 24 (with no sign change), and once again reach the north end as another negative transient. The time $t_n$ between these transients is equal to twice the distance to the fault from the northern end of the line divided by the speed of propagation.

Sometime later, the positive wave 20 launched from the fault in the southerly direction reaches the southern station, reflects as wave 26 with no sign change, propagates through the fault as wave 28 with no sign change, and finally reaches the northern station as a positive transient. The time $t_s$ between this transient and the first one received equals twice the distance to the fault from the southern end of the line divided by the speed of propagation.

Summarizing, the fault just described causes current transients to be received at the northern end 14 having these polarities: $--+$. The time $t_n$ between the two minuses is proportional to the distance to the fault from the north end 14. The time $t_s$ between the first minus and the plus is proportional to the distance to the fault from the southern end 12.

Figure 2:
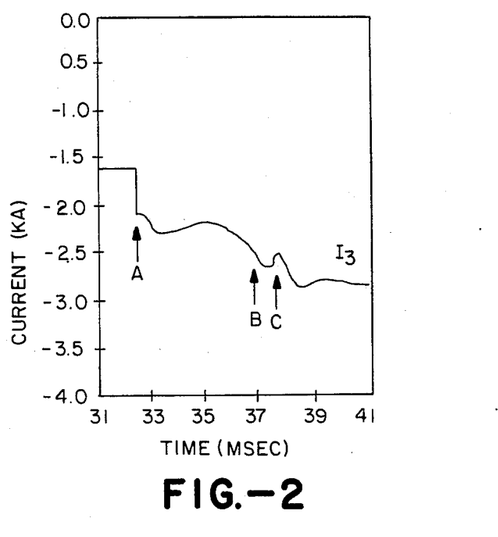
FIG. 2 is a current diagram which graphically depicts the occurrence of fault-generated transients at one end of a transmission line.

FIG. 2 illustrates an actual case observed in the field on a transmission line similar to the hypothetical case described. Here the wave launched to the north is negative, and the transients denoted by the arrows A, B, C have a sign pattern of $--+$, respectively.

Figure 3:
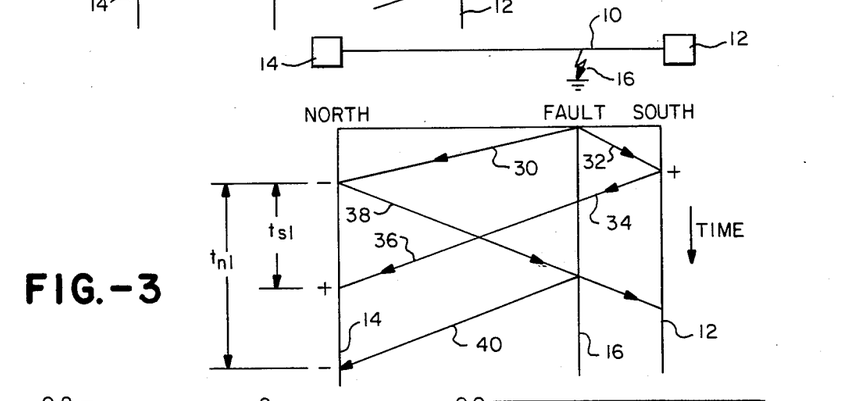
FIG. 3 is a diagram similar to FIG. 1 wherein the fault occurs near the southern terminal of the transmission line.

What if the fault occurred closer to the southern end as shown in FIG. 3? Assuming the same polarities of launched waves, the first wave 30 to reach the northern station is the one launched in the northerly direction. The second transient observed at the northern station, however, is now the positive wave 32 which travels south from the fault to the southern station as wave 32, is reflected with no sign change as wave 34, passes through the fault, and reaches the northern station as wave 36. The time $t_{s1}$ between this positive wave and the negative transient is equal to twice the distance to the fault from the southern end divided by the speed of propagation.

The third transient received is the wave which had begun as a northerly-traveling wave, was reflected by the northern station, propagates to the fault as wave 38, is reflected back to the north as wave 40, and finally reaches the northern station. Thus, the time $t_{n1}$ between this transient and the first one observed equals twice the distance to the fault from the northern station divided by the speed of propagation. The sign pattern of observed transients is: $-+-$.

Since the sign patterns are different, we can distinguish between the two cases just described. The time ($t_n$ or $t_{n1}$) between the like signs always gives us the distance between the north end and the fault. The time ($t_s$ or $t_{s1}$) between the first transient and the unlike sign always yield the distance between the south end and the fault.

Figure 7:
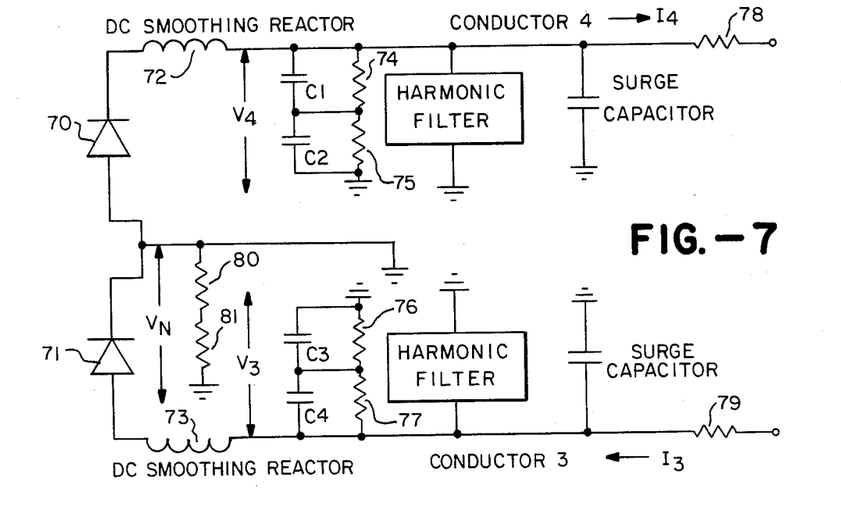
FIG. 7 schematically illustrates a station termination circuit.

To provide the most accurate and reliable readings of fault location, it is necessary to distinguish the traveling waves from other disturbances, such as electrical breakdown on the converter side of a dc smoothing reactor at a terminal of the transmission line (See FIG. 7). It is also necessary to accurately measure the time difference between the arrivals of the transmission line transients. Transmission line transients observed on the line side of a dc smoothing reactor have very fast rise times, in comparison to transients on the converter side of the reactor. Thus, rate of change provides an effective discriminate.

Figure 4:
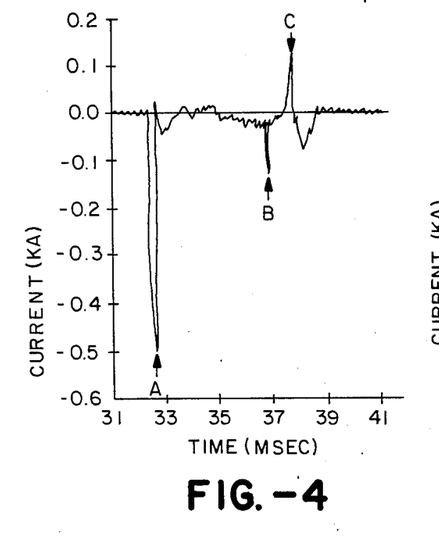
FIG. 4 illustrates the output of a differentiator smoother wherein the input is the current shown in FIG. 2.

Measuring the relative time of arrival of the transients may be accomplished by passing sampled data through a digital filter such as a differentiator-smoother having a three-sample window. The output of this filter is a positive pulse for positive-going transients, and a negative pulse for negative-going transients. The filter output for disturbances on the converter side of the dc smoothing reactor is quite small, owing to the slow risetime observed on the other side of the reactor. FIG. 4 shows the output current from a differentiator-smoother for the current of FIG. 2. The arrows A, B, C again represent the transients having the sign pattern − − +.

Figure 9:
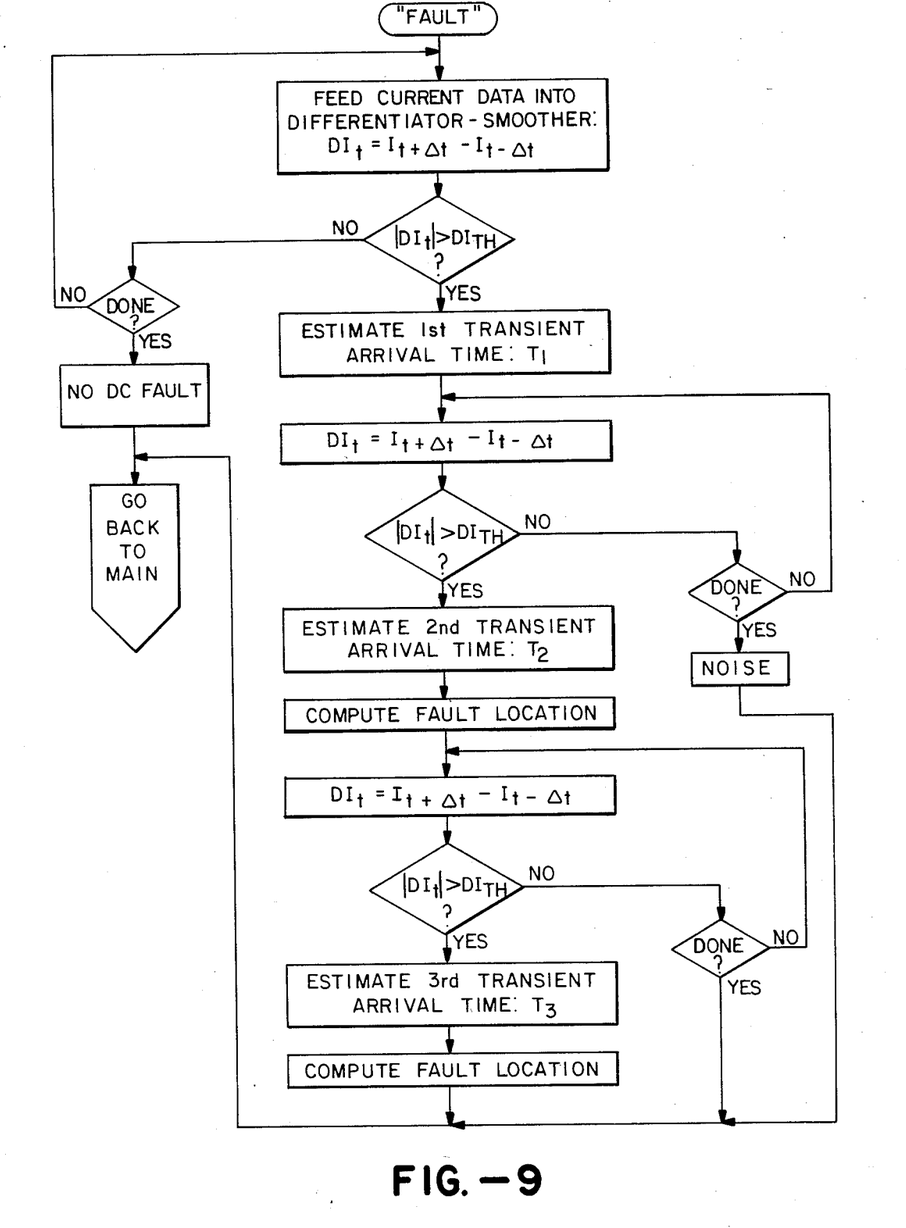
FIG. 9 is a fault program flowchart.

The differentiator-smoother may be an analog device or, alternatively, as in the preferred embodiment of the present invention, this function may be achieved by an appropriate computer program (See FIG. 9).

A multichannel data-acquisition and processing system described hereinafter may be utilized to provide the sample data. Voltage and current data may be filtered and sampled at a rate of about 25,000 samples per second. This rate is not very critical, although accuracy is lost at significantly slower rates.

Again referring to FIG. 4, a time quantization of 37.5 microseconds implies a distance resolution of about 3.5 miles. However, the signal-to-noise ratio is quite good, so interpolative techniques can be used with success to refine the estimate of the actual time of arrival of the transient to within about one-fourth of one sample period, or about one mile A technique which may be used is a simple four-sample triangulation interpolation algorithm which is described below with respect to FIG. 5.

The technique of observing the relative polarity of the wavefronts is important, novel and key to sorting out the wavefronts. Also important is the use of a differentiator-smoother to detect the arrival time of a wavefront. The output of the differentiator-smoother may be expressed by the following equation:

$$y_k = x_{k+1} - x_{k-1} \qquad \text{(Eq. 1)}$$

where k is an index of time, data samples are designated x, and y is the differentiator-smoother output at the $k^{th}$ instant of time. Since the first difference representation of a derivative is not normalized with respect to the sample period, the units of y are amperes, instead of amperes per second.

The time-of-arrival of a wavefront is determined within one sample period by noting the time index of the peak value of the differentiator-smoother output. The location accuracy afforded by this technique is the sampling interval times the speed of propagation divided by two, or about four miles. Fortunately, better accuracy at the same sampling rate can be obtained by interpolation, as mentioned earlier.

A simple interpolator was implemented to determine the time between sampling instants at which the peak actually occurred. The algorithm used is to define two straight lines representing the upward and downward slopes of the differentiator-smoother pulse output. The time instant for the peak is taken as the intersection point of the two straight lines. The four values of the differentiator-smoother output nearest the peak output are found, and the two lines are determined from the first two and last two of the selected points.

Figure 5:
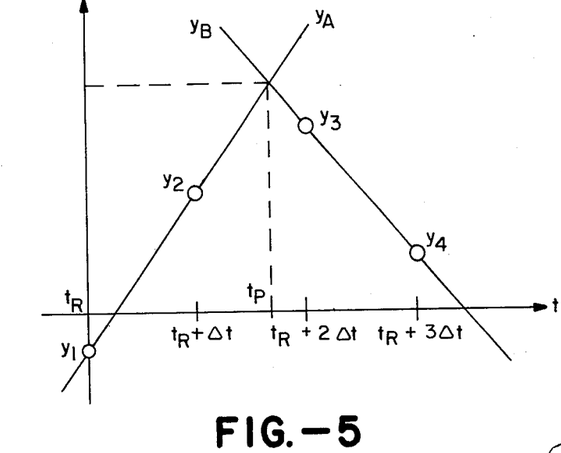
FIG. 5 illustrates a four-sample triangulation interpolation algorithm.

Let the four values of the differentiator-smoother output be $y_1$, $y_2$, $y_3$, and $y_4$. Referring to FIG. 5, two straight lines $y_A$ and $y_B$ are:

$$y_A(t) = \frac{y_2 - y_1(t - t_R)}{\Delta t} + y_1 \qquad \text{(Eq. 2)}$$

$$y_B(t) = \frac{y_4 - y_3(t - t_R)}{\Delta t} + 3y_3 - 2y_4 \qquad \text{(Eq. 3)}$$

The intersection point of $y_A$ and $y_B$ is the estimated peak point $y_P$, and $t_R$ is a reference time from which all other times are measured. Let the corresponding time of $y_P$ to $t_P$. Furthermore, let two consecutive peak times be $t_{P1}$ and $t_{P2}$. The fault location can be computed using $t_{P1}$ and $t_{P2}$ as follows:

$$\text{Fault location} = \left( \frac{(t_{P2} + t_{R2}) - (t_{P1} + t_{R1})}{2} \right) v \qquad \text{(Eq. 4)}$$

where $v$ is the transient propagation speed, $t_{R1}$ and $t_{R2}$ are the reference times of the first and second transients, respectively.

Referring back to FIGS. 2 and 4, there is graphically illustrated a current $I_3$ that was actually generated in the field by a fault and the output of the differentiator-smoother for current $I_3$, respectively. The fault was a pole to ground fault that occurred on Oct. 6, 1983 at 389.8 miles from the northern terminal of a transmission line. The transmission line was the Pacific HVDC Interite, owned by the U.S. Department of Energy—BPA and the Los Angeles Department of Water and Power. This line terminates at its southern end at the Sylmar station, and at its northern end at the Celilo station.

As shown, the first transient outputs are negative (arrows A and B), and the third transient is positive (arrow C). This indicates that the fault occurred within the northern half of the line. Furthermore, the short interval between the second and third transient outputs of the differentiator-smoother implies that the fault is near the center of the line. Using the peak slope estimator (the four-point triangulation interpolator) the three transient arrival times were computed. The time period between the first two transients divided by two is the time required for the fault-generated transient to propagate from the fault point to the Celilo station. It is computed to be 2116.57 μsec. On the other hand, the time period between the first and third transients divided by two is the propagation time from the fault point to the southern end. It is computed to be 2485.55 μsec. Now the propagation speed of the fault-generated transients must be found.

Four sets of fault data were used. Two time periods from each fault were computed: one is the time corresponding to the distance between the northern end and the fault and the other is the time corresponding to the distance between the fault and the southern end. The total length of the transmission line (848.2 miles) divided by the sum of these two time periods is the propagation speed of the fault-generated transients. Table 1 shows the results. The propagation speed averaged over the four cases is $2.96914 \times 10^8$ m/sec, which is 0.99041 times the speed of light in free space. Using this propagation speed, Table 2 shows the comparison between the BPA "Type B" fault locator and the SPR readings. This comparison indicates that the simple passive reflectometer agrees with the two-end time-of-arrival scheme to within less than one mile.

TABLE 1

| PROPAGATION SPEED ESTIMATION | | | | |
|---|---|---|---|---|
| DATE | $T_1$ ($\mu$sec) | $T_2$ ($\mu$sec) | $T_1 + T_2$ ($\mu$sec) | $\nu$ ($\times 10^8$ m/sec) | $\nu/C$ |
| 9/1/83 | 123.70 | 4469.83 | 4593.53 | 2.97167 | 0.99125 |
| 10/6/83 | 2116.57 | 2485.55 | 4602.12 | 2.96612 | 0.98940 |
| 11/30/83 | 1865.63 | 2732.18 | 4597.81 | 2.96890 | 0.99033 |
| 1/30/84 | 1424.70 | 3171.63 | 4596.33 | 2.96986 | 0.99065 |

$T_1$: Propagation time from fault to Celilo
$T_2$: Propagation time from fault to Sylmar
$\nu$: Estimated propagation speed
C: Speed of light

TABLE 2

| FAULT LOCATION COMPARISON | | | |
|---|---|---|---|
| DATE | BPA Type B (miles) | SPR (miles) | Difference (miles) |
| 9/1/83 | 23.0 (Celilo) | 22.82 | −0.18 |
| | 825.2 (Sylmar) | 824.66 | −0.54 |
| 10/6/83 | 389.8 (Celilo) | 390.49 | 0.69 |
| | 458.4 (Sylmar) | 458.57 | 0.17 |
| 11/30/83 | 344.5 (Celilo) | 344.20 | −0.30 |
| | 503.7 (Sylmar) | 504.07 | 0.37 |
| 1/30/84 | 262.5 (Celilo) | 262.85 | 0.35 |
| | 585.7 (Sylmar) | 585.15 | −0.55 |

The Pacific HVDC Interite is terminated capacitively (See FIG. 7 wherein the station termination circuitry is shown). Its termination circuitry includes mercury arc values 70, 71, which represent dc to ac converters, and dc smoothing reactors 72, 73, which prevent fast change of the current when a short circuit occurs at the converter side of the dc smoothing reactor. The transmission line includes two conductors, conductors 3 and 4.

As discussed heretofore, it is necessary to distinguish between dc faults (faults on the dc line side of the smoothing reactor) and other disturbances such as station faults and ac faults (faults on the converter side of the dc smoothing reactor). The smoothing reactor was very useful in accomplishing such discrimination. No disturbance on the converter side of the dc smoothing reactor can cause a steep change in the current or the voltage at the dc line side of the dc smoothing reactor. The output of the differentiator-smoother generally remains within ±60 amperes. Thus, a differentiator-smoother output threshold value of 100 amperes may be utilized to discriminate between line faults and other events.

Figure 6:
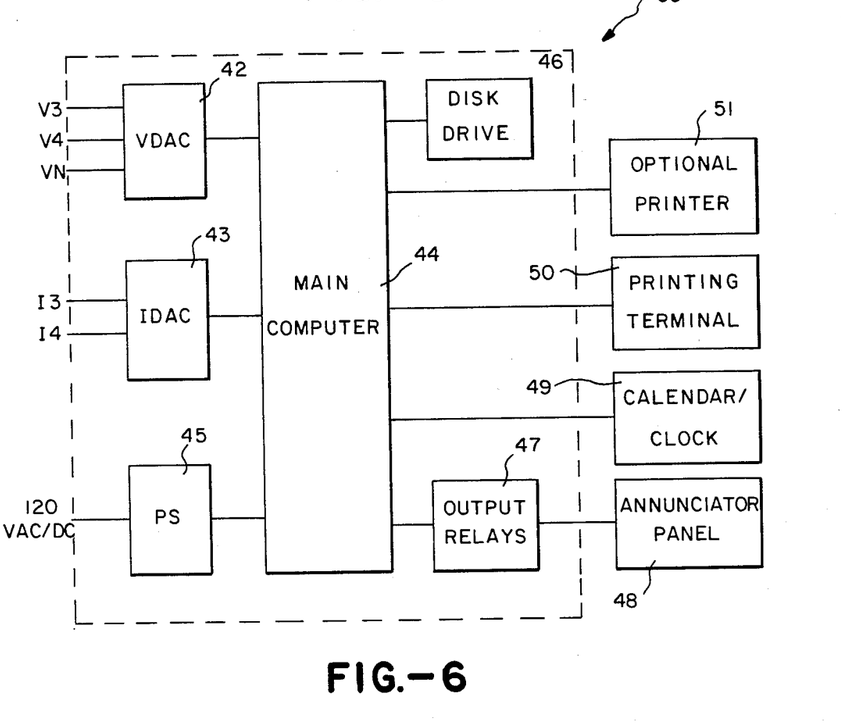
FIG. 6 is a block diagram that illustrates the main components of a preferred embodiment of a data collection system of the present invention.

FIG. 6 illustrates the main components of a data collection system 60 of a preferred embodiment of the present invention. These data collection system was utilized experimentally to generate the above-discussed data from the Pacific HVDC Interite. Of course, it should be apparent that other system designs may be utilized to achieve the results of the present invention, and that such other designs may be either computer implemented or analog.

The data collection system 60 of FIG. 6 includes a voltage data acquisition computer ("VDAC") 42, a current data acquisition computer ("IDAC") 43, a main computer 44, and at least one 120 VAC/DC power supply ("PS") 45. In addition, the system includes a floppy disk drive 46, output relays 47, annunciator panel 48, a calendar/clock 49, and at least one printing terminal 50. An optional printer 51 may also be provided.

The system may accept five analog inputs (See also FIG. 7) which are proportional to the line voltages ($V_3$, $V_4$), line currents ($I_3$, $I_4$), and the neutral bus voltage ($V_N$). The system monitors these inputs. The neutral bus voltage ($V_N$) input is not necessarily for fault location computation in accordance with the present invention. The system also has an event (fault) detection function to trigger saving data onto a diskette.

Five sensors may be employed for the data collection system. One sensor is employed for each of line voltages $V_3$, $V_4$, neutral bus voltage $V_N$, and line currents $I_3$, $I_4$. The $V_3$ and $V_4$ voltage sensors, as shown in FIG. 7, may comprise two compensated voltage dividers representated by resistor pair 74, 75 for $V_4$ and resistor pair 76, 77 for $V_3$. An uncompensated voltage divider representated by resistors 80, 81 may be utilized for $V_N$. Two current shunts represented by resistors 78 and 79 may be used to sense currents $I_4$ and $I_3$, respectively.

Figure 8:
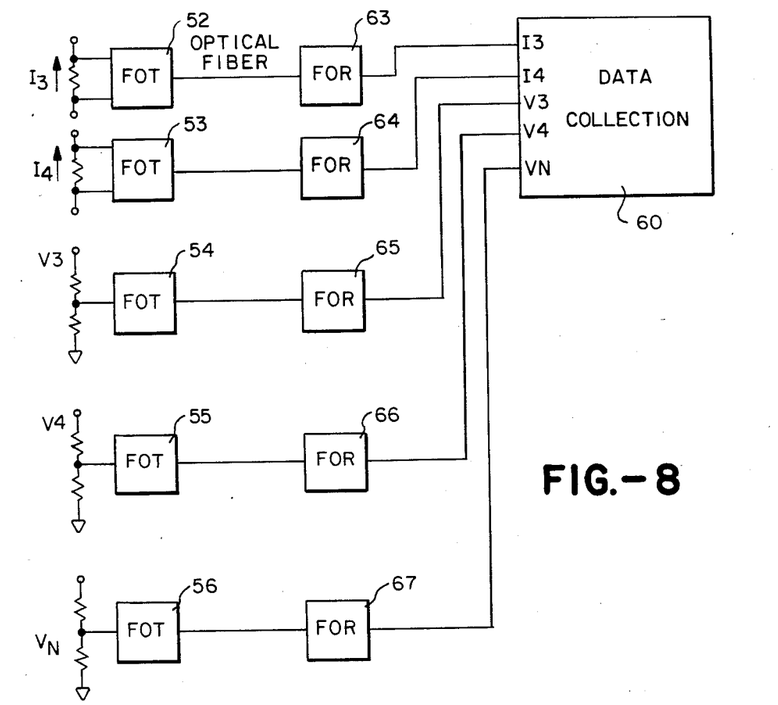
FIG. 8 schematically illustrates a fiber optic transmission and reception scheme between voltage and current sensors, and the main components of the data collection system.

The sensors' output signals are transformed to frequencies using voltage-to-frequency ("V/F") converters. Then they may be transmitted to a control room via fiber optic transmitters ("FOT") 52–56. (See FIG. 8). At the control room fiber optic receiver units ("FOR") 63–67 (See FIG. 8) are provided to convert the frequencies back to analog voltages using frequency-to-voltage ("F/V") converters. The bandwidth of the fiber optic transmitter and receiver system may be 20 kHz. Finally, these analog voltages are fed into the data collection system 60 which has front-end antialising low-pass filters, whose cut-off frequencies may be 10 kHz.

As noted the compensated voltage dividers (See FIG. 7) are employed to measure $V_3$ and $V_4$. The compensated voltage dividers offer a fast step response by parallel-connected capacitive voltage dividers $C_1$, $C_2$, and $C_3$, $C_4$. The compensated voltage divider bandwidth is assumed to be better than 10 kHz.

Since the direction of power flow in the system is determined by the voltage polarities, the line voltages reverse in polarity when the direction of power flow is reversed. When the line is terminated capacitively and the termination station where the sensors are located is operated in the rectifier mode, the conductor 3 line voltage ($V_3$) is negative, and the conductor 4 line voltage ($V_4$) is positive. In the inverter mode, the voltages reverse, causing the conductor 3 line voltage to be positive, and the conductor 4 line voltage to be negative. When the termination station operates with a monopolar-metallic return, the uncompensated resistive voltage divider is used to measure the neutral voltage ($V_N$).

Current shunts, resistors 78, 79, having resistances of 50$\mu\Omega$ were installed on the dc line side of the surge capacitor, on both conductor 3 and conductor 4 at the Celilo (northern) converter station. The FOTS are connected to the outputs of the shunts. The voltages across the shunts, which are proportional to the line currents ($I_3$, $I_4$), are converted to corrresponding frequencies. After transmission through the fiber optic links, the frequencies are converted back to analog voltages which are further fed into the data collection system 60.

An event detector is required to trigger the data collection process. It may be expected that the dc voltage drops more than 300 kV within 4 msec due to a typical dc fault under ±400 kV operation. So the objective of the event detector is to catch large dc voltage changes.

In order to detect dc disturbances, an event detection algorithm is preferably utilized. It may comprise a first-order recursive digital filter and a threshold comparator. The algorithm is given below.

$$e_i = z_i - x_i \quad \text{(Eq. 5)}$$

$$x_{i+1} = x_i + K \cdot e_i \quad \text{(Eq. 6)}$$

Event detected if $|e_i| > V_{th}$ (Eq. 7)

where
- $z_i$ is the measurement data (line voltage).
- $x_i$ is the estimated value.
- K is a constant.
- $V_{th}$ is the threshold voltage.

The initial value of $x_i$ is set to the first measured data, $x_0 = z_0$.

Under steady-state operation, the error e is very small. In fact if we assume pure dc operation, e should be zero. However, we expect a small contribution due to the ripple caused by the conversion process and the measurement noise.

Eq. 6 provides the first-order low-pass filter. Its cutoff frequency depends on the values of K and sampling period T.

The event detector works as follows. The updated estimate value $x_i$ is compared to the measurement data $z_i$. If the difference ($e_i$) between $x_i$ and $z_i$ is larger than the threshold $V_{th}$, it is concluded that a line disturbance has occurred.

From a practical point of view, K=0.5 offers the most economical computational burden since only one right shift is required. Therefore, K=0.5 is selected. For the Pacific HVDC Interite described aboe, the monopolar metallic return under one group-operation (133 kV) provides the worst case. The transmission line resistance at 25° C. per conductor is 18.95 Ω. Suppose a far-end line fault occurs. Furthermore, assume that the pre-fault current is 2000 amperes. The voltage drop due to the line resistance is 2000 A×37.9 Ω=75.8 kV. This implies that a potential difference of only 57 kV between the pre- and post-fault voltages could be expected in the steady state. Therefore, $V_{th}$ should be less than 57 kV and $V_{th}$ is chosen to 50 kV.

Referring again to FIG. 6, the five analog signals ($V_3$, $V_4$, $V_N$, $I_3$, $I_4$) are lowpass filtered, sampled, and converted to binary numbers every 37.5 μsec by the two data acquisition computers 42, 43. These computers store the samples in circular buffers providing a 154 msec record of the newest samples.

Every millisecond, a voltage sample from each channel is transferred to the main computer 44, where they are digitally filtered to determine if a line voltage disturbance has occurred. If one has, then the data acquisition process continues for another 120 msec, then stops. The data acquisition computer 42, 43 memories now contain 34 msec of pre-disturbance data, and 120 msec of post-disturbance voltage and current data. Next, these data are transferred from the data acquisition computers, through the main computer, and onto disk.

A printing terminal 50 is provided for system startup, testing and control. A calendar/clock 49 provides day and time data to the main computer. An annunciator panel 48 monitors the status of two output relays, to indicate disk-full or processor-stall conditions.

FIG. 9 is a flowchart illustrating a program operation for locating faults in accordance with the present invention. Particularly, fault data are preserved or previewed by the differentiator-smoother $DI_t = I_{t+\Delta t} - I_{t-\Delta t}$ wherein $DI_t$ is the first order differential of current taken over two sample periods, $I_{t+\Delta t}$ is the newest sample of current, and $I_{t-\Delta t}$ is a current sample which is two sample periods old. The output $DI_t$ of the differentiator-smoother is compared against a threshold current ($DI_{TH}$) by means of a threshold detector. If this comparison ($|DI_t| > DI_{TH}$) indicates that the output current $DI_t$ of the differentiator-smoother is less than the threshold current $DI_{TH}$, no further action is taken as indicated by the "DONE" symbol. The "DONE" symbol also indicates that all relevant data has been reviewed by the program.

If the magnitude of the output current $DI_t$ is greater than the threshold $DI_{TH}$, the arrival time $T_1$ of the first transient is then estimated. Thereafter, the above-described process is repeated to detect second and third transients. Specifically, the current samples are fed into a second differentiator-smoother $DI_t = I_{t+\Delta t} - I_{t-\Delta t}$ to determine whether a second transient exists. If $DI_t$ is less than $DI_{TH}$, then the first transient is assumed to be caused by noise. If the second transient is detected by the threshold detector ($|DI_t| > DI_{TH}$), then the second transient arrival time $T_2$ is estimated. Thereafter, the fault location may be computed.

After the second transient is detected, the identical procedure is used to search for a third transient. This procedure utilizes a third differential-smoother $DI_t = I_{t+\Delta t} - I_{t-\Delta t}$ and a third threshold detector ($|DI_t| > DI_{TH}$). If a third transient is detected, its arrival time $T_3$ is estimated, and another estimate of fault location is computed. If no third transient is detected, there is no more data to look at, as indicated by the "DONE" symbol.

Utilizing the above-discussed format, it is possible to estimate a fault location based upon the detection of two transients or, alternatively, based upon the detection of three transients. Computation of fault location based upon detection of three transients provides a more accurate reading of fault location.

It is expected that modifications could be made to the system of the present invention for use with an ac transmission line system.

Although certain specific embodiments of the present invention have been described herein in detail, the invention is not to be limited only to such embodiments, but rather only by the appended claims.

What is claimed is:

1. A system for locating a fault in a transmission line, comprising:
    means at one end of the transmission line for detecting transients at said one generated by a fault;
    means at said one end for sorting said transients produced by a fault and reflected either by said one end or an end of the transmission line remote therefrom, said transients sorted by polarity and said sorting means connected to said detecting means; and
    means at said one end for determining the arrival times of said transients at said one end and for calculating the difference between said arrival times so as to determine the location of the fault.

2. A system for location faults on a transmission line, comprising:
    means at one end of the transmission line for detecting transients at said one end generated by a fault and reflected either by said one end or an end of the transmission line remote therefrom;

means at said one end for sorting said transients by polarity, said sorting means connected in circuit with said detecting means;

means at said one end for determining the arrival times of said transients at said one end, said determining means connected in circuit with said sorting means; and means at said one end for calculating the difference between the arrival times of said transients, which are sorted by polarity by said sorting means so as to determine the location of the fault, said calculating means connected in circuit with said determining means.

3. The system of claim 1 or 2 wherein said detecting means comprises a software routine for performing the function of a differentiator-smoother.

4. The system of claim 1 or 2 wherein said transients may be either voltage or current transients.

5. The system of claim 1 or 2 capable of locating a ground fault, a line-line fault, a line-line-ground fault, or an open conductor.

6. The system of claim 1 or 2 having the capability to measure the distance from the fault to said one end as well as the distance from the fault to an opposite end of the transmission line.

7. The system of claim 1 or 2 utilizing an impedance discontinuity at at least one end of the transmission line but not requiring a specific measurement of the impedance discontinuity.

8. The system of claim 1 or 2 capable of locating a fault even if data are not available from a faulted conductor but are available from an unfaulted conductor.

9. The system of claim 1 or 2 wherein the location of the fault may be determined by calculating the difference between the arrival times of two consecutive transients detected at said one end.

10. The system of claim 2 further including a software routine for performing the function of an interpolator for determining said arrival time.

11. A system for locating faults on a transmission line, comprising:

means at one end of the transmission line for detecting transients at said one end generated by a fault;

means at said one end for sorting said transients produced by a fault and reflected either by said one end or an end of the transmission line remote therefrom and said transients sorted by polarity, said sorting means connected to said detecting means;

means at said one end for determining the respective arrival time of said transients at said one end, said determining means connected to said sorting means; and means at said one end for calculating the difference between the arrival time of a first and second or first and third transient so as to determine the location of the fault.

12. A process for locating a fault on a transmission line, comprising the steps of:
(a) detecting fault-generated transients at one end of the transmission line reflected either by said one end or an end of the transmission line remote therefrom;
(b) sorting said transients by polarity;
(c) determining the arrival times of said transients at said one end; and
(d) measuring the difference between the arrival times of said transients, which are sorted by polarity, at said one end so as to determine the location of the fault.

13. The process of claim 12 wherein the location of the fault is determined by measuring the difference between the arrival times of a first and second transient at said one end.

14. The process of claim 12 wherein the location of the fault is determined by measuring the difference between the arrival times of a first and third transient at said one end.

15. The process of claim 12 including measuring the difference between the arrival times of transients of like polarity so as to determine the location of the fault from said one end.

16. The process of claim 15 including measuring the difference between the arrival times of transients of unlike polarity so as to determine the location of the fault from an opposite end of the transmission line.

17. The process of claim 12 including measuring the arrival time of the transient generated by a first wave reaching said one end directly from the fault; measuring the arrival time of the transient generated by a second wave reflected from said one end, travelling to the fault, being reflected by the fault, and then travelling back to said one end; and measuring the arrival time of the transient generated by a third wave launched by the fault, reflected at an opposite end of the line, travelling back to the fault, passing through the fault, and then reaching said one end.

18. The process of claim 17 further including measuring the difference between the arrival times of the transients generated by the first and second waves to determine the location of the fault.

19. The process of claim 17 further including measuring the difference between the arrival times of the transients generated by the first and third waves to determine the location of the fault.

* * * * *

UNITED STATES PATENT AND TRADEMARK OFFICE
CERTIFICATE OF CORRECTION

PATENT NO. : 4,766,549
DATED : August 23, 1988
INVENTOR(S) : Edmund O. Schweitzer, III et al It is certified that error appears in the above-identified patent and that said Letters Patent is hereby corrected as shown below:

Column 1, lines 5-6, "location" should read -- locating --.

Column 2, line 63, "lines" should read -- times --.

Column 9, line 32, "aboe" should read -- above --.

Column 10, Claim 1, line 4, "said one generated" should read -- said one end generated --.

Signed and Sealed this

Ninth Day of May, 1989

Attest:

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO.  : 4,766,549
DATED       : August 23, 1988
INVENTOR(S) : Edmund O. Schweitzer, III et al It is certified that error appears in the above—identified patent and that said Letters Patent is hereby corrected as shown below:

ON TITLE PAGE: under item 73 (Assignee:) please add the following additional assignee:

Washington State University
Research Foundation
Pullman, Washington

Signed and Sealed this

Third Day of December, 1991

Attest:

HARRY F. MANBECK, JR.

*Attesting Officer*  *Commissioner of Patents and Trademarks*